US009680121B2

(12) United States Patent
Guo et al.

(10) Patent No.: US 9,680,121 B2
(45) Date of Patent: Jun. 13, 2017

(54) ORGANIC LIGHT-EMITTING DIODE AND AN ELECTRONIC DEVICE INCLUDING AN ORGANIC LIGHT-EMITTING DIODE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Yuanhui Guo, Beijing (CN); Feng Qin, Beijing (CN); Hui Wang, Beijing (CN); Chun Wang, Beijing (CN); Yisan Zhang, Beijing (CN)

(73) Assignees: BOE TECHNOLOGY GROUP CO., LTD. (CN); HEFEI BOE OPTOELECTRONICS TECHNOLOGY CO., LTD. (CN)

( * ) Notice: Subject to any disclaimer, the term of this patent is extended or adjusted under 35 U.S.C. 154(b) by 175 days.

(21) Appl. No.: 14/407,560

(22) PCT Filed: May 26, 2014

(86) PCT No.: PCT/CN2014/078394
§ 371 (c)(1),
(2) Date: Dec. 12, 2014

(87) PCT Pub. No.: WO2015/096376
PCT Pub. Date: Jul. 2, 2015

(65) Prior Publication Data
US 2016/0308158 A1    Oct. 20, 2016

(30) Foreign Application Priority Data
Dec. 24, 2013    (CN) .......................... 2013 1 0723025

(51) Int. Cl.
*H01L 51/50* (2006.01)
*H01L 51/00* (2006.01)

(52) U.S. Cl.
CPC ........ *H01L 51/5044* (2013.01); *H01L 51/504* (2013.01); *H01L 51/5008* (2013.01);
(Continued)

(58) Field of Classification Search
CPC .................................................. H01L 2924/00
See application file for complete search history.

(56) References Cited

U.S. PATENT DOCUMENTS 5,521,726 A * 5/1996 Zimmerman ........ G02B 5/3025
349/159
7,360,936 B2 * 4/2008 Abu-Ageel ............ G02B 5/045
257/95
(Continued)

FOREIGN PATENT DOCUMENTS

| CN | 1711653 A | 12/2005 |
|---|---|---|
| CN | 103050634 A | 4/2013 |

(Continued)

OTHER PUBLICATIONS

International Search Report and Written Opinion in PCT International Application No. PCT/CN2014/078394, dated Jul. 30, 2014.
(Continued)

*Primary Examiner* — Caridad Everhart
*Assistant Examiner* — Ankush Singal
(74) *Attorney, Agent, or Firm* — Bakerhostetler LLP

(57) ABSTRACT

The present invention discloses an organic light-emitting diode (OLED) and an electronic device, wherein the OLED includes a first carrier transport layer and a second carrier transport layer that are set opposite to each other, and a light-emitting layer; the light-emitting layer includes a first light-emitting sub-layer with a hollow structure, and a
(Continued)

second light-emitting sub-layer which includes a body part and a projecting part, wherein the projecting part projects from the body part and is accommodated in the hollow structure; wherein a surface of the first light-emitting sub-layer and a surface of the projecting part form the first surface of the light-emitting layer, and a surface of the body part forms the second surface of the light-emitting layer. By the present invention, the working voltage is lowered, the power consumption is reduced, and in addition, the manufacturing process is simplified due to the reduction of the number of layers.

20 Claims, 5 Drawing Sheets

(52) U.S. Cl.
CPC ...... *H01L 51/5056* (2013.01); *H01L 51/5072* (2013.01); *H01L 51/0085* (2013.01); *H01L 51/5012* (2013.01); *H01L 51/5016* (2013.01); *H01L 2251/5307* (2013.01); *H01L 2251/5315* (2013.01)

(56) References Cited

U.S. PATENT DOCUMENTS

| | | | | |
|---|---|---|---|---|
| 7,911,134 B2* | 3/2011 | Prakash | ............. | H01L 51/0003 313/506 |
| 8,053,770 B2* | 11/2011 | D'Andrade | ......... | H01L 27/3211 257/40 |
| 8,692,242 B1* | 4/2014 | Jou | .................... | H01L 51/5036 257/40 |
| 2004/0222736 A1* | 11/2004 | Yoneda | ................. | H01L 27/322 313/503 |
| 2005/0017629 A1* | 1/2005 | Vitukhnovsky | ........ | C09K 11/06 313/504 |
| 2005/0040392 A1* | 2/2005 | Wu | .................... | H01L 27/3211 257/40 |
| 2008/0067924 A1 | 3/2008 | Prakash et al. | | |
| 2008/0166566 A1* | 7/2008 | Prakash | ............. | H01L 51/0037 428/421 |
| 2008/0211385 A1* | 9/2008 | Kim | .................... | H01L 51/0096 313/498 |
| 2008/0258611 A1 | 10/2008 | Su et al. | | |
| 2010/0045175 A1* | 2/2010 | Mathai | ................ | H01L 27/3209 313/504 |
| 2010/0090241 A1 | 4/2010 | D'Andrade et al. | | |
| 2011/0242264 A1* | 10/2011 | Kubota | .................... | B41J 2/451 347/258 |
| 2011/0267813 A1* | 11/2011 | Kubota | .................. | F21V 5/002 362/235 |
| 2013/0069044 A1* | 3/2013 | Ma | ...................... | H01L 51/5036 257/40 |
| 2013/0146853 A1* | 6/2013 | Lee | ..................... | H01L 27/3216 257/40 |
| 2013/0187183 A1* | 7/2013 | Hoppel | ................ | H01L 33/382 257/98 |
| 2013/0277697 A1* | 10/2013 | Lai | .......................... | H01L 33/60 257/98 |
| 2013/0313535 A1* | 11/2013 | Heo | .................... | H01L 51/5064 257/40 |
| 2014/0168572 A1* | 6/2014 | Iwata | ................. | H01L 51/5268 349/61 |
| 2014/0183475 A1* | 7/2014 | Song | ................... | H01L 27/3209 257/40 |
| 2014/0218626 A1* | 8/2014 | Jung | ................... | H01L 51/5281 348/803 |
| 2014/0353626 A1* | 12/2014 | Shim | .................... | G02B 3/0037 257/40 |
| 2015/0090984 A1* | 4/2015 | Kang | ................. | H01L 51/5278 257/40 |
| 2015/0162559 A1* | 6/2015 | Wu | ........................ | H01L 51/56 257/40 |
| 2016/0141338 A1* | 5/2016 | Li | ....................... | H01L 27/3209 257/40 |

FOREIGN PATENT DOCUMENTS

| | | |
|---|---|---|
| CN | 103715367 A | 4/2014 |
| JP | 2006253097 A | 9/2006 |
| JP | 2012204164 A | 10/2012 |

OTHER PUBLICATIONS

Office Action in Chinese Patent Application No. 201310723025.X, dated Aug. 5, 2015.

* cited by examiner

ORGANIC LIGHT-EMITTING DIODE AND AN ELECTRONIC DEVICE INCLUDING AN ORGANIC LIGHT-EMITTING DIODE

CROSS REFERENCE TO RELATED APPLICATION

This application is the U.S. national phase of PCT Application No. PCT/CN2014/078394 filed on May 26, 2014, which claims priority to Chinese Patent Application No. 201310723025.X filed on Dec. 24, 2013, the disclosures of which are incorporated in their entirety by reference herein.

TECHNICAL FIELD

The present invention relates to organic light emitting diodes, and in particular, to a low-power consumption and easily-manufactured organic light emitting diode (OLED) and an electronic device.

BACKGROUND

At present, full-color display is one of the objects of the development of OLED. A full-color image requires obtaining continuously adjustable colors in the range of visible wavelengths, and white light is a light that contains the three primary colors of red, green and blue in the visible light range. If a white-light OLED is combined with the well-developed microelectronic-etching color filter technology, a full-color OLED, which has an easy manufacturing process, a good reproducibility and a low cost, can be obtained.

Currently, there are many kinds of structures that can realize white light OLED, including multiple-device stacked structure, color conversion structure, single-light emitting layer structure and multi-light emitting layer structure, etc. Among these structures, the multi-light emitting layer structure is widely applied in the white light OLED due to the advantages of relatively easy process and good color stability.

FIG. 1 shows a common OLED with a multi-light emitting layer structure, which includes a cathode and an anode, as well as an electron transport layer, a second light-emitting sub-layer, an isolation layer, a first light-emitting sub-layer, a hole transport layer and the like provided in sequence between the cathode and the anode.

It may be found that, in the above OLED with the multi-light emitting layer structure, the number of device layers included is large, thus a high voltage is required to drive a/an hole/electron to a light-emitting layer, which causes a high power consumption. In addition, the complexity of the process will also be raised due to the large number of layers.

However, the above OLED with the multi-light emitting layer structure may be a white-light OLED, or it may be an OLED that emits light of other colors.

SUMMARY

It is an object of the present invention to provide an OLED and an electronic device, thereby allow the power consumption and the complexity of the manufacturing process of the OLED can be lowered.

To attain the above object, one embodiment of the present invention provides an OLED, which includes: a first carrier transport layer and a second carrier transport layer that are set opposite to each other; and a light-emitting layer located between the first carrier transport layer and the second carrier transport layer; the light-emitting layer includes a first surface and a second surface that are opposite to each other, carriers transported by the first carrier transport layer enter the light-emitting layer via the first surface, and carriers transported by the second carrier transport layer enter the light-emitting layer via the second surface, and the light-emitting layer includes:
a first light-emitting sub-layer with a hollow structure; and
a second light-emitting sub-layer, which includes:
a body part; and
a projecting part, which projects from the body part and is accommodated in the hollow structure;
wherein a surface of the first light-emitting sub-layer and a surface of the projecting part form the first surface of the light-emitting layer, and a surface of the body part forms the second surface of the light-emitting layer.

In the above OLED, an energy gap of a second material of the second light-emitting sub-layer is larger than an energy gap of a first material of the first light-emitting sub-layer.

In the above OLED, the OLED is a bottom-emission OLED, the first carrier transport layer is a hole transport layer, the second carrier transport layer is an electron transport layer, and the hole transport layer, the first light-emitting sub-layer, the second light-emitting sub-layer and the electron transport layer are arranged in sequence.

In the above OLED, the OLED is a top-emission OLED, the first carrier transport layer is a hole transport layer, the second carrier transport layer is an electron transport layer, and the electron transport layer, the first light-emitting sub-layer, the second light-emitting sub-layer and the hole transport layer are arranged in sequence.

In the above OLED, the first material is a red light-emitting material or an orange light-emitting material, and the second material is a blue light-emitting material.

In the above OLED, the first material is a red phosphorescent material or an orange phosphorescent material, and the second material is a blue phosphorescent material.

In the above OLED, the first carrier transport layer is one of an electron transport layer and a hole transport layer, and the second carrier transport layer is the other of the electron transport layer and the hole transport layer.

In the above OLED, a ratio of the area of the hollow structure of the first light-emitting sub-layer to the area of the non-hollow structure of the first light-emitting sub-layer is (2:8)-(3:7).

In order to achieve the above object, one embodiment of the present invention further provides an electronic device, which includes the above OLED.

The above electronic device is a display apparatus or a backlight for a liquid crystal display.

In the embodiments of the present invention, light-emitting sub-layers that emit lights of different colors are combined together in a way of engagement, and no isolation layer is set. In the OLED according to the embodiments of the present invention, the isolation layers in the existing OLED with a multi-light emitting layer structure may be omitted, thus the number of layers of the OLED may be reduced, the working voltage is lowered, and the power consumption is reduced, and in addition, the manufacturing process is simplified due to the reduction of the number of layers.

DETAILED DESCRIPTION

In the OLED and the electronic device according to the embodiments of the present invention, light-emitting sub-layers that emit lights of different colors are combined together in a way of engagement, electrons and holes can enter different sub-layers in the light-emitting layer, thereby different light-emitting sub-layers emit lights of different colors, and a light of a new color can be formed after mixing of those lights of different colors, so that the isolation layer in the existing OLED with a multi-light emitting layer structure can be omitted, thus the number of layers of the OLED may be reduced, the working voltage of the OLED may be lowered, and the power consumption may be reduced, and in addition, the manufacturing process may be simplified due to the reduction of the number of layers.

Figure 1:
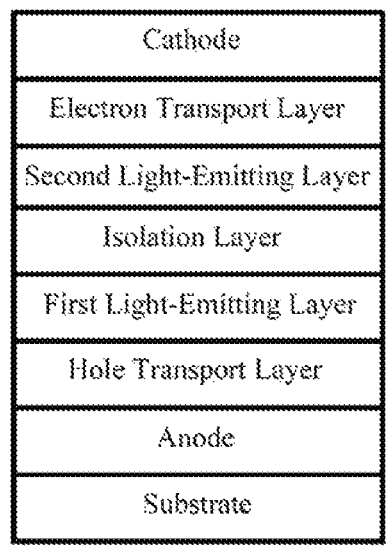
FIG. 1 shows a structural representation of an existing OLED with a multi-light emitting layer structure.
Figure 2:
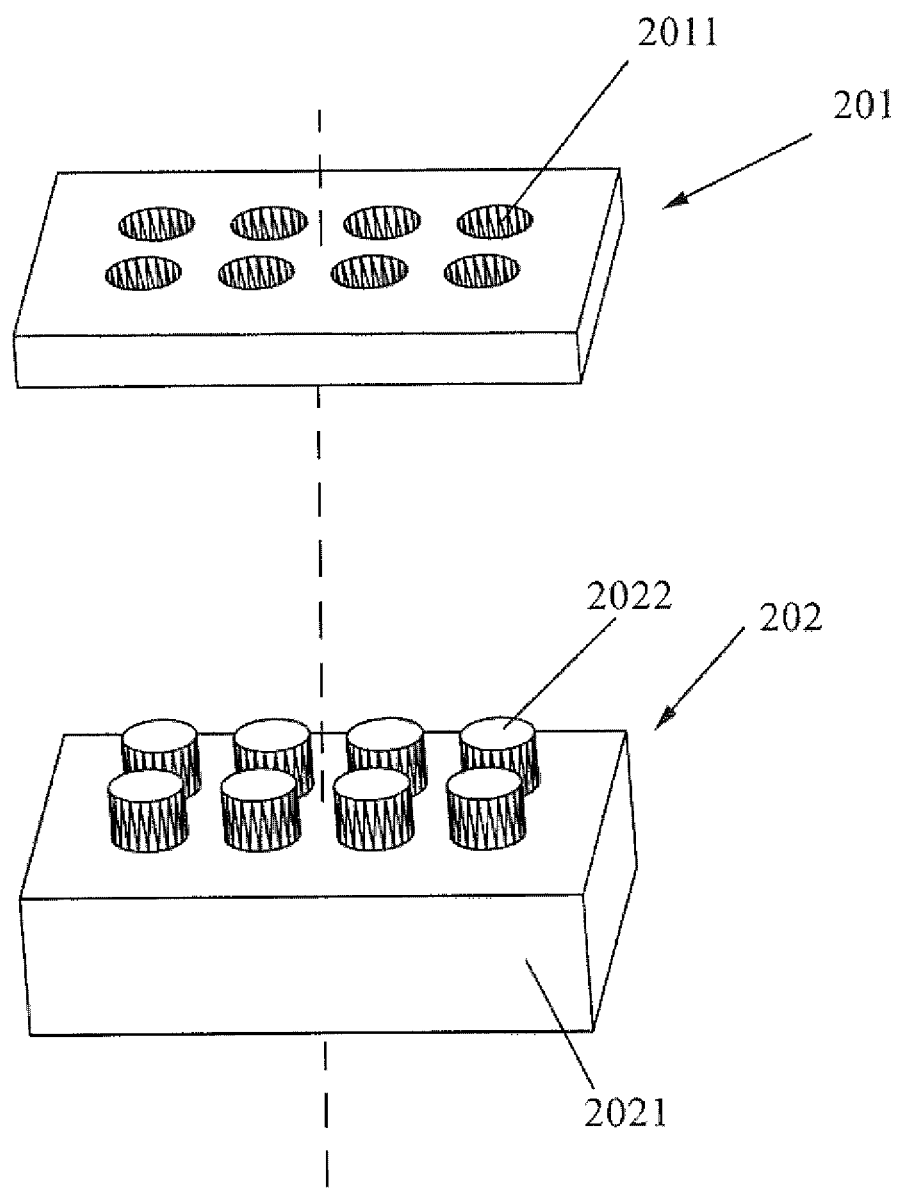
FIG. 2 shows a exploded schematic diagram of a first light-emitting sub-layer and a second light-emitting sub-layer according to one embodiment of the present invention.
Figure 3:
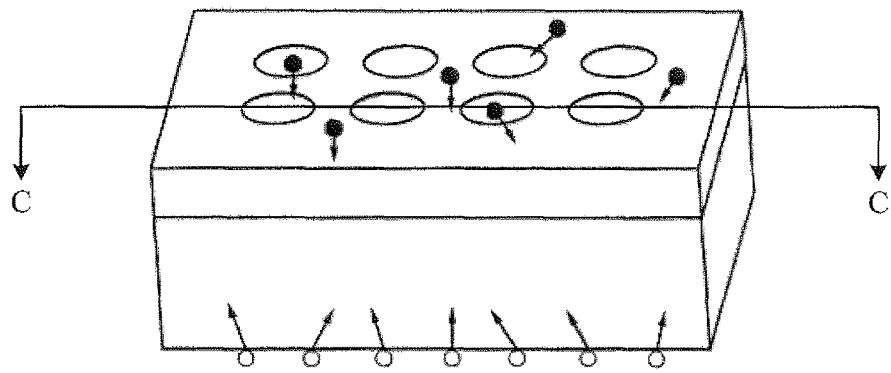
FIG. 3 shows a fitting schematic diagram of a first light-emitting sub-layer and a second light-emitting sub-layer according to one embodiment of the present invention.

One embodiment of the present invention provides an OLED, which includes: a first carrier transport layer and a second carrier transport layer that are set opposite to each other, and a light-emitting layer located between the first carrier transport layer and the second carrier transport layer; the light-emitting layer includes a first surface and a second surface that are opposite to each other, first carriers transported by the first carrier transport layer enter the light-emitting layer via the first surface, second carriers transported by the second carrier transport layer enter the light-emitting layer via the second surface; in conjunction with FIG. 2 and FIG. 3, the light-emitting layer includes:

a first light-emitting sub-layer 201 with a hollow structure 2011; and a second light-emitting sub-layer 202, which includes:
a body part 2021; and
a projecting part 2022, which projects from the body part 2021 and is accommodated in the hollow structure 2011;

wherein one surface of the first light-emitting sub-layer 201 and the surface of the projecting part 202 form the first surface of the light-emitting layer, and one surface of the body part 2021 (the undersurface in the figure) forms the second surface of the light-emitting layer.

In terms of the structure, the OLED according to the embodiments of the present invention does not include any isolation layer, thus in comparison with the OLED with a multi-light emitting layer structure of the prior art, the number of layers may be reduced, so that the working voltage of the OLED may be lowered, and the power consumption may be reduced. In addition, the manufacturing process is simplified due to the reduction of the number of layers.

In FIG. 2, the hollow structure 2011 is a circular hollow structure, and also, the projecting part 2022 is a cylindrical structure corresponding thereto. However, it should be understood that the shapes of the projecting part and the hollow structure above are not limited to the embodiments of the present invention. For example, the hollow structure 2011 may also be a quadrate hollow structure, and also, the projecting part 2022 may be a quadrate hollow structure corresponding thereto. The above hollow structure may even have a triangular shape or other irregular shapes, and it will not influence the implementation of the embodiments of the present invention, it will not be listed one by one here.

The light emitting process of the OLED according to the embodiments of the present invention will be described as follows.

The whole structural layer of the OLED at least includes: a hole transport layer (HTL), a light-emitting layer (EL) and an electron transport layer (ETL). When a forward bias derived from direct current (DC) is applied, the energy of the applied voltage will drive the electrons and the holes to be injected into the light-emitting layer from a cathode and an anode, respectively. In the process in which the electrons move in the light-emitting layer and fill the locations of the holes, electrons obtain the energy (electrical energy) and fly away from the attachment of the original atoms, then they are captured by the holes, and the original energy obtained is released; after the energy released is transferred to the organic molecules in the light-emitting layer, the organic molecules are made to transit from the ground state to the unstable excited state, and when the molecules in the unstable excited state return to the ground state from the excited state, a light emitting phenomenon occurs.

Figure 4:
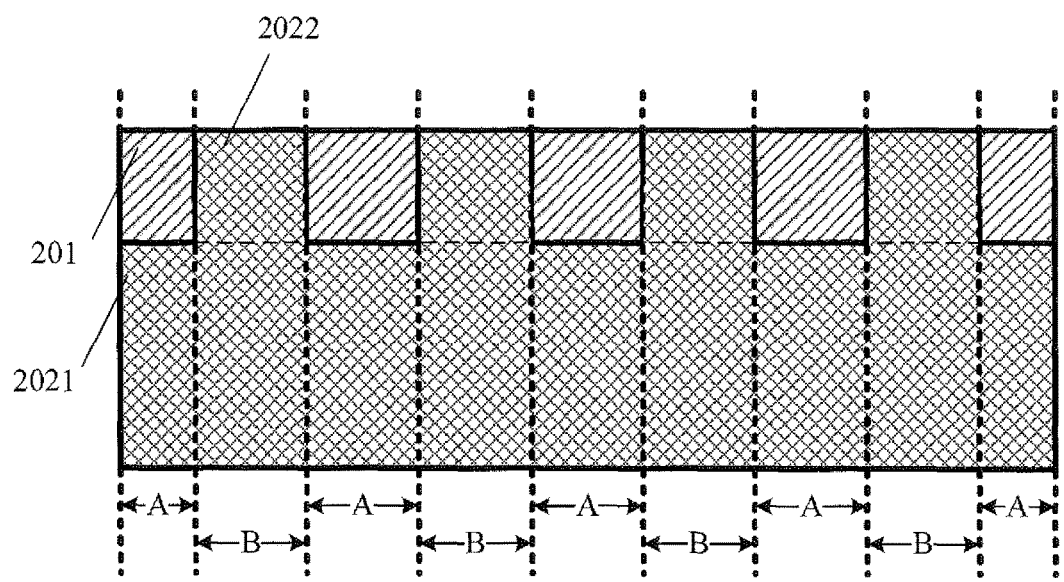
FIG. 4 shows a schematic sectional view of the light-emitting sub-layer of FIG. 3 taken along direction C-C.

FIG. 4 is a sectional view of FIG. 3 taken along direction C-C. In conjunction with FIG. 3 and FIG. 4, the light-emitting region of the OLED may be divided into two kinds: region A (in this region, the whole light-emitting layer has a two-layer structure, which includes a first light-emitting sub-layer and a second light-emitting sub-layer) and region B (in this region, the whole light-emitting layer has a single-layer structure, which only includes a second light-emitting sub-layer), wherein in the region A, a first carrier (marked by a solid circle with an arrow in FIG. 3) and a second carrier (marked by a hollow circle with an arrow in FIG. 3) enter the light-emitting layer via the first light-emitting sub-layer 201 and the body part 2021 of the second light-emitting sub-layer, respectively; in the region B, the first carrier and the second carrier enter the light-emitting layer via the body part 2021 and the projecting part 2022 of the second light-emitting sub-layer, respectively.

In region B, the first carrier and the second carrier enter the same light-emitting sub-layer, i.e., the second light-emitting sub-layer, thus in region B, the first carrier and the second carrier directly meet and combine in region B and form an Electron-Hole Capture. After the energy released in the above process is transferred to the organic molecules of the second light-emitting sub-layer, the organic molecules is made to transit from the ground state to the unstable excited state, and when the molecules in the unstable excited state return to the ground state from the excited state, a light emitting phenomenon occurs Almost all the light-emitting layers in the current OLEDs employ a structure of a host-guest system, i.e., a guest light-emitting material is doped in a host light-emitting material, and light is emitted by transferring energy from the host light-emitting material with larger energy to the guest light-emitting material, thus the color of the light emitted by the device may be adjusted and controlled by selecting different guest light-emitting materials, and the efficiency of the device may be improved.

In a host-guest light-emitting material system, there may be two energy transfer modes: Förster energy transfer and Dexter energy transfer, respectively. In Förster energy transfer, energy is transferred in a way of long distance dipole-dipole induction; if the irradiation of the host light-emitting body overlaps with the absorption of the guest light-emitting body and the transition thereof is permitted, a rapid and nonluminous energy transfer occurs between the host light-emitting body and the guest light-emitting body.

In Dexter energy transfer, energy is transferred in a way of short-distance electron exchange, and transfer of electrons must comply with the Wigner-Wigner selecting rule, that is, the spin parameters of both the electrons are kept constant before and after the transfer process, thus energy transfer only occurs between a singlet state and a singlet state and between a triplet state and a triplet state; moreover, because such a mechanism only acts among adjacent molecules, this process is slow.

Thus, in the light-emitting layer of a phosphorescent device, the energy of the host material in the singlet excited state and the triplet excited state may be respectively transferred to the singlet excited state and the triplet excited state of a phosphorescent light-emitting body via Förster energy transfer and Dexter energy transfer, and then the energy of the singlet excited state is converted into the triplet excited state via a rapid intersystem crossing inside the phosphorescent light-emitting body, thereby phosphorescence is emitted.

It may be found in combination with the above description that, if two light-emitting materials directly contacts with each other, energy transfer between triplet state and triplet state will be made very apparent, and when an OLED is lighted up, the energy of a light-emitting sub-layer with a larger energy gap will excite a light-emitting sub-layer with a smaller energy gap to emit light, so that the device will produce a light emitted by the light-emitting sub-layer with a smaller energy gap.

When the energy gap of the second material of the second light-emitting sub-layer is larger than the energy gap of the first material of the first light-emitting sub-layer, a light will be emitted by the first light-emitting sub-layer in the above region A.

Because the region A and the region B are distributed alternately, finally, the light emitted by the whole light-emitting layer is a mixture of lights of different colors emitted by the first light-emitting sub-layer and the second light-emitting sub-layer.

An illustration is given below in an example in which the first light-emitting sub-layer (i.e., the part with a hollow structure) is formed of a red phosphorescent material/orange phosphorescent material while the second light-emitting sub-layer (i.e., the part with a projecting part) is formed of a blue phosphorescent material, in conjunction with FIG. 4 and FIG. 5.

Figure 5:
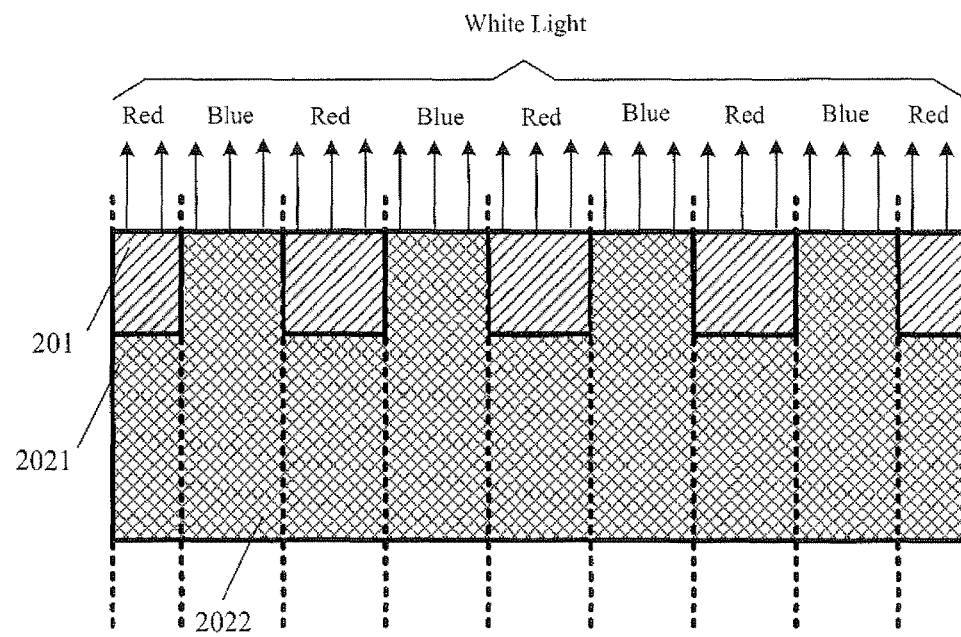
FIG. 5 is a schematic diagram showing the light-emitting status of the OLED according to the embodiments of the present invention.

Because the energy gap of a blue phosphorescent material is larger than the energy gap of a red phosphorescent material/an orange phosphorescent material, in the region A shown in FIG. 4 and FIG. 5, the energy of the blue light-emitting sub-layer with a larger energy gap excites the red light-emitting sub-layer with a smaller energy gap to emit light, so that the device produce a red light emitted by the red light-emitting sub-layer with a smaller energy gap. In other words, in the region A where different materials overlap with each other, energy transfer will occur between the red light-emitting sub-layer and the blue light-emitting sub-layer, so that the overlapped region still emit the original red light/orange light. While in region B, the electrons and the holes meet and combine directly in region B and release blue light.

Finally, the light emitted by the whole device is a white light formed by mixing the red light/orange light and the blue light.

In the prior art, in order to counteract the energy transfer of the light-emitting sub-layer with a larger energy gap, an isolation layer is generally added between two light-emitting sub-layers, thus the energy transfer between phosphorescent materials of different colors may be effectively blocked, and Dexter energy transfer may be inhibited. In other words, before the present application is filed, one skilled in the art considers that phosphorescent materials of different colors in an OLED should not contact directly with each other, otherwise, unstability of the OLED will be caused. However, by the embodiments of the present invention, the above conventional perception of one skilled in the art may be changed, and the above Dexter energy transfer is utilized to form a mixed light directly, and the stability of the mixed-color OLED can be improved (which will be verified below by an experimental result). Therefore, according to the technical solution of the present application, technical prejudice is overcome, and unpredictable technical effect is obtained.

In addition, it may be found that in one specific embodiment of the present invention, a semiconductor device is formed with a region A and a region B, and by the selection of materials, in region A, the first light-emitting sub-layer emits light by the energy transfer from the second light-emitting sub-layer, while in region B, the second light-emitting sub-layer will not be influenced by the first light-emitting sub-layer and it will work according to the original principle, thus the problem of insufficient light emitting of a light-emitting sub-layer with a relatively high energy gap in an existing light-emitting device without an isolation layer may be avoided.

It may be found in conjunction with the above description that, in order to guarantee that the OLED forms a mixed color, the energy gap of the second material of the second light-emitting sub-layer should be larger than the energy gap of the first material of the first light-emitting sub-layer.

In one specific embodiment of the present invention, the above mixed-color OLED is a white-light OLED; in this case, the first material may be a red light-emitting material or an orange light-emitting material, and the second material may be a blue light-emitting material.

In view of the problem of low utilization efficiency of the fluorescence, in one specific embodiment of the present invention, a light-emitting sub-layer is formed by a phosphorescent material with a high light-emitting efficiency, that is, the first material is a red phosphorescent material or an orange phosphorescent material, and the second material is a blue phosphorescent material.

The light-emitting status of the OLED is shown by FIG. 5 in an example in which the first material is a red light-emitting material and the second material is a blue light-emitting material.

In the above OLED, the first carrier transport layer is one of an electron transport layer and a hole transport layer, and the second carrier transport layer is the other of the electron transport layer and the hole transport layer.

Illustration will be further given below by an example in which the first carrier transport layer is a hole transport layer and the second carrier transport layer is an electron transport layer.

Figure 6A:
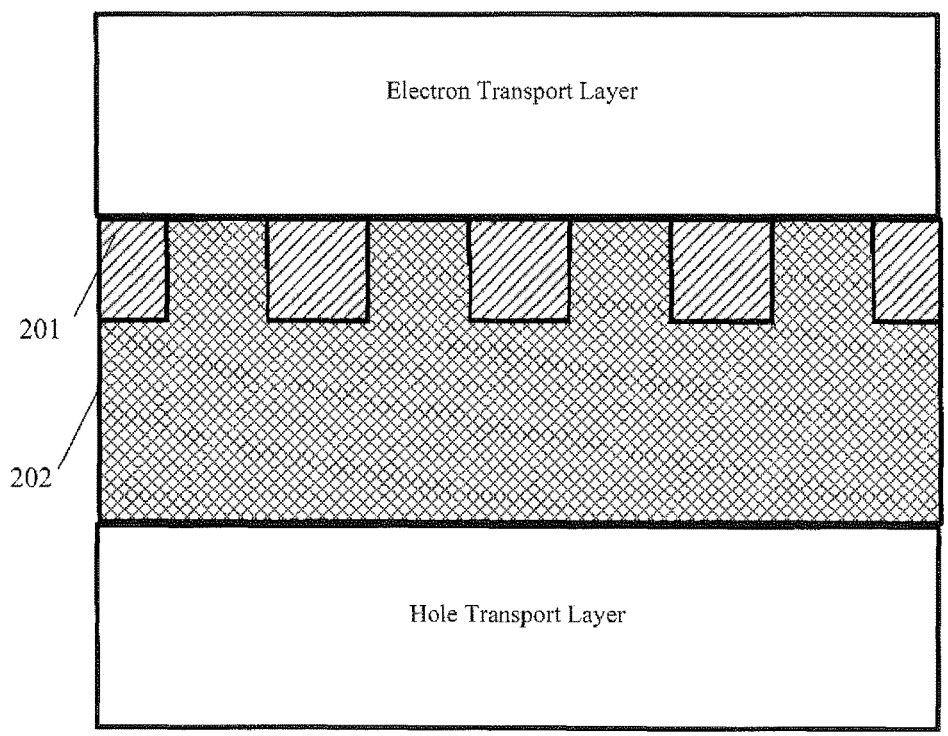
FIG. 6a and FIG. 6b are respectively structural representations of two kinds of OLEDs according to the embodiments of the present invention.

The first light-emitting sub-layer 201 is closer to the electron transport layer, while the second light-emitting sub-layer 202 is closer to the hole transport layer, and the structure of the OLED formed by the above light-emitting layers is as shown in FIG. 6a.

The OLED shown in FIG. 6a is a top-emission OLED, wherein the first carrier transport layer is a hole transport layer, the second carrier transport layer is an electron transport layer, and the electron transport layer, the first light-emitting sub-layer, the second light-emitting sub-layer and the hole transport layer are arranged in sequence.

Figure 6B:
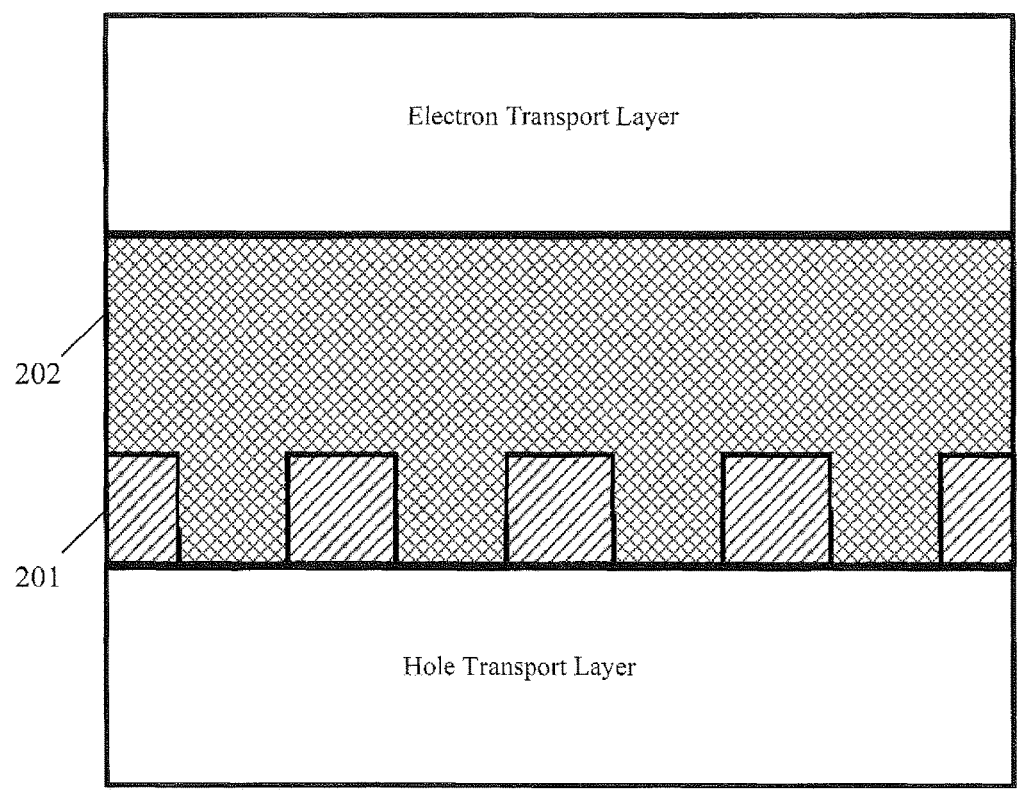

However, it should be noted that, the first light-emitting sub-layer 201 may also be closer to the hole transport layer, the second light-emitting sub-layer 202 may be closer to the electron transport layer, and the structure of the OLED formed by the above light-emitting layer is as shown in FIG. 6b.

The OLED shown in FIG. 6b is a bottom-emission OLED, the first carrier transport layer is a hole transport layer, the second carrier transport layer is an electron transport layer, and the hole transport layer, the first light-emitting sub-layer, the second light-emitting sub-layer and the electron transport layer are arranged in sequence.

In one specific embodiment of the present invention, the above hollow structure/projecting part is arranged uniformly, so that the lights emitted by two light-emitting sub-layers can be mixed better.

In one specific embodiment of the present invention, the ratio of the area of the first light-emitting sub-layer to the area of the hollow structure may be adjusted according to the requirements on light emitting. For example, the ratio of the area of the first light-emitting sub-layer to the area of the hollow structure is 10:2 or 10:3 (i.e., the ratio of the area of the hollow structure of the first light-emitting sub-layer to the area of the non-hollow structure of the first light-emitting sub-layer is 2:8 or 3:7).

In the device of the present invention, the first light-emitting layer employs a hollow structure, and the second light-emitting layer directly contacts with the electron transport layer and the hole transport layer, which is helpful to lower the operating voltage. Generally, the material of the first light-emitting layer of the device of the present invention is a red light material or an orange light material, and energy transfer will occur between it and the blue light material of the second light-emitting layer, thus red light or orange light can emit from the device successfully. Therefore, by adjusting the area of the hollow structure and the thickness of each film layer, white-light OLED devices of different specifications may be obtained.

It may be found that, in one specific embodiment of the present invention, the coordinate of white light of the OLED may be adjusted by adjusting the thickness of the first light-emitting sub-layer, the size and location of the hollow structure and the thickness of the second light-emitting sub-layer, etc.

Apparently, in specific embodiments of the present invention, the hole transport layer and the electron transport layer may have a single-layer structure, or they may have a multi-layer structure.

When the hole transport layer has a multi-layer structure, it includes: a hole injection layer and an electron barrier layer.

When the electron transport layer has a multi-layer structure, it includes: an electron injection layer and a hole barrier layer.

To achieve the above object, one embodiment of the present invention further provides an electronic device, which includes the above OLED.

The above electronic device is a display apparatus or a backlight for a liquid crystal display.

The preparation of the above light-emitting layer will be illustrated below.

If the second light-emitting sub-layer is closer to a glass substrate, in this case, the preparation of the light-emitting layer includes the following steps:

First, a layer of the second light-emitting material is formed;

Then, a projecting part 2022 as shown in FIG. 2 is obtained via a one-time MASK process;

Finally, a layer of the first light-emitting material is formed, and because a part of the region is blocked by the projecting part, a hollow structure is formed naturally.

If the first light-emitting sub-layer is closer to a glass substrate, in this case, the preparation of the light-emitting layer includes the following steps:

First, a layer of the first light-emitting material is formed;

Then, a first light-emitting layer 201 with a hollow structure 2011 as shown in FIG. 2 may be obtained via a one-time MASK process or a printing process;

Finally, a layer of the second light-emitting material is formed, wherein since the first light-emitting layer includes a hollow structure, when the layer of the second light-emitting material layer is formed, the hollow structure will be naturally filled by the second light-emitting material, and a second light-emitting sub-layer 202 with a projecting part 2022 as shown in FIG. 2 will be formed.

It should be understood that during the preparation of the OLED, other layers further need to be manufactured, which are the same as those of the prior art, thus no further detailed description will be given here.

The performance of the OLED device according to the embodiments of the present invention will be verified as follows.

In the structure of a OLED device with an isolation layer of the prior-art, the following layers are included in sequence from the glass substrate:

an ITO layer;

an anode modified layer, which is formed of $MoO_x$ (a molybdenum oxide), with a thickness of 3 nm;

a hole injection layer, which is formed of m-MTDATA (4,4',4"-tri(3-benzylphenylamino)-triphenylamine), with a thickness of 25 nm;

a hole transport layer, which is formed of (N,N'-bi(1-naphthyl)-N,N'-diphenyl-1,1'-biphenyl-4-4'-diamine), with a thickness of 10 nm;

a red light or orange light-emitting layer, with a thickness of 5 nm; wherein the host material is 4,4'-di(9-carbazolyl)biphenyl (4,4'-dicarbazolyl-9-ylbiphenyl), and the guest material is (acetylacetone)bis(2-methyldibenzo[F,H]quinoxaline)iridium, and the doping dosage of the guest material is 0.5 wt %;

an isolation layer, with a thickness of 5 nm;

a blue light-emitting layer, with a thickness of 25 nm, wherein the basis material is 4,4'-di(9-carbazolyl)biphenyl (4,4'-dicarbazolyl-9-ylbiphenyl), and the doping material is bis(4,6-difluorophenylpyridine-N,C2)pyridineformyl iridium, and the doping dosage of the guest material is 10 wt %;

an electron transport layer, which is formed of Bphen (4,7-diphenyl-1,10-phenanthroline), with a thickness of 40 nm;

a cathode modified layer, which is formed of LiF (lithium fluoride), with a thickness of 0.5 nm; and a cathode, which is formed of Al, with a thickness of 100 nm.

In the above OLED of the prior art, when driven by a voltage of 8V, the color coordinate of the light emitted is (0.4149, 0.4404); when driven by a voltage of 14V, the color coordinate is (0.398, 0.435). The maximum external quantum efficiency of the OLED of the prior art is 2.9%.

It may be found that, when the driving voltage is changed by 6V, the ratio of changes of the color coordinate is (4%, 1.2%).

In the structure of the OLED device without an isolation layer according to the embodiment of the present invention, the following layers are included in sequence from the glass substrate:

an ITO layer;

an anode modified layer, which is formed of $MoO_x$, with a thickness of 3 nm;

a hole injection layer, which is formed of m-MTDATA (4,4',4"-tri(3-benzylphenylamino)-triphenylamine), with a thickness of 25 nm;

a hole transport layer, which is formed of (N,N'-di(1-naphthyl)-N,N'-diphenyl-1,1'-biphenyl-4-4'-diamine), with a thickness of 10 nm;

a red light or orange light emitting layer, with a thickness of 5 nm, wherein the basis material is 4,4'-di(9-carbazolyl) biphenyl (4,4'-dicarbazolyl-9-ylbiphenyl), the doping material is (acetylacetone)bis(2-methyldibenzo[F,H]quinoxaline) iridium, and the doping dosage of the guest material is 0.5 wt %;

a blue light-emitting layer, with a thickness of 25 nm, wherein the host material is 4,4'-di(9-carbazolyl)biphenyl (4,4'-dicarbazolyl-9-ylbiphenyl), the guest material is bis(4, 6-difluorophenylpyridine-N,C2)pyridineformyl iridium, and the doping dosage of the guest material is 10 wt %;

an electron transport layer, which is formed of Bphen (4,7-diphenyl-1,10-phenanthroline), with a thickness of 40 nm;

a cathode modified layer, which is formed of LiF (lithium fluoride), with a thickness of 0.5 nm; and a cathode, which is formed of Al, with a thickness of 100 nm.

In addition, the ratio of the area of the hollow structure of the first light-emitting sub-layer to the area of the non-hollow structure of the first light-emitting sub-layer is 3:7.

In the above OLED, the initial voltage is 4V, and when driven by a voltage of 9V, the color coordinate of the light emitted is (0.401, 0.420), and the maximum external quantum efficiency of the above OLED is 4.6%.

When driven by a voltage of 12V, the color coordinate of the light emitted is (0.396, 0.418), and the magnitude of changes of the color coordinate caused by the increase of the voltage is small, which indicates that the color coordinate is well maintained under different voltages.

It may be found that, in the OLED according to the embodiments of the present invention, when the driving voltage is changed by 3V, the ratio of changes of the color coordinate is (1.2%, 0.48%), and the magnitude of changes thereof is much smaller than the ratio of changes (4%, 1.2%) of the color coordinate of the OLED of the prior art when the driving voltage is changed by 6V.

In addition, for an ordinary double-layer white-light OLED device, in order to guarantee that the device emits a white light successfully, it is required to increase the thickness of the blue light-emitting layer or the doping dosage of the guest material in the blue light-emitting layer. The initial voltage of an ordinary device is generally larger than 5V, and the redness phenomenon of the color coordinate is severe under a low voltage.

When the ratio of the area of the hollow structure of the first light-emitting sub-layer to the area of the non-hollow structure of the first light-emitting sub-layer is changed to 2:8, the initial voltage of the OLED according to the present invention is 4.3V, which is still much lower than the above initial voltage of at least 5V for the OLED of the prior art.

It may be found from the above result that, in comparison with the OLED of the prior art set with an isolation layer, the OLED according to the embodiments of the present invention has the following beneficial effects:

1) The driving voltage required of the OLED according to the embodiments of the present invention is relatively small, and the power consumption of the device is lowered;

2) The number of layers in the OLED according to the embodiments of the present invention is reduced, and the complexity of the manufacturing process is lowered;

3) The light emitted by the OLED according to the embodiments of the present invention is more similar to white light;

4) When the voltage changes, the magnitude of changes of the color coordinate of the light emitted by the OLED according to the embodiments of the present invention is smaller, thus it is more stable; and 5) The external quantum efficiency of the OLED according to the embodiments of the present invention is higher than the external quantum efficiency of the OLED of the prior art.

Apparently, various modifications and variations may be made by one skilled in the art without departing from the spirit and scope of the present invention. Thus, if modifications and variations of the present invention fall into the scope of the claims of the present invention and their equivalents, the present invention tends to encompass these modifications and variations.

The above description only shows some preferred implementations of the present invention. It should be noted that, certain improvements and substitutions may be made by one of ordinary skills in the art without departing from the technical principles of the present invention. Therefore, all these improvements and substitutions should be construed as falling into the protection scope of the present invention.

What is claimed is:

1. An organic light-emitting diode (OLED), comprising: a first carrier transport layer and a second carrier transport layer that are set opposite to each other, and a light-emitting layer located between the first carrier transport layer and the second carrier transport layer, wherein the light-emitting layer comprises a first surface and a second surface that are opposite to each other, carriers transported by the first carrier transport layer enter the light-emitting layer via the first surface, carriers transported by the second carrier transport layer enter the light-emitting layer via the second surface, and the light-emitting layer comprises:

a first light-emitting sub-layer with a hollow structure; and a second light-emitting sub-layer, which comprises:
  a body part; and
  a projecting part, which projects from the body part and is accommodated in the hollow structure;
wherein a surface of the first light-emitting sub-layer and a surface of the projecting part form the first surface of the light-emitting layer, and a surface of the body part forms the second surface of the light-emitting layer;

and wherein there is no isolation layer between the first light-emitting sub-layer and the second light-emitting sub-layer.

2. The OLED according to claim 1, wherein an energy gap of a second material of the second light-emitting sub-layer is larger than an energy gap of a first material of the first light-emitting sub-layer.

3. The OLED according to claim 2, wherein the OLED is a bottom-emission OLED, the first carrier transport layer is a hole transport layer, the second carrier transport layer is an electron transport layer, and the hole transport layer, the first light-emitting sub-layer, the second light-emitting sub-layer and the electron transport layer are arranged in sequence.

4. The OLED according to claim 2, wherein the OLED is a top-emission OLED, the first carrier transport layer is a hole transport layer, the second carrier transport layer is an electron transport layer, and the electron transport layer, the first light-emitting sub-layer, the second light-emitting sub-layer and the hole transport layer are arranged in sequence.

5. The OLED according to claim 2, wherein the first material is a red light-emitting material or an orange light-emitting material, and the second material is a blue light-emitting material.

6. The OLED according to claim 5, wherein the first material is a red phosphorescent material or an orange phosphorescent material, and the second material is a blue phosphorescent material.

7. The OLED according to claim 1, wherein the first carrier transport layer is one of an electron transport layer and a hole transport layer, and the second carrier transport layer is the other of the electron transport layer and the hole transport layer.

8. The OLED according to claim 1, wherein the first light-emitting sub-layer comprises a plurality of hollow structures which are uniformly arranged.

9. The OLED according to claim 1, wherein a ratio of an area of the hollow structure of the first light-emitting sub-layer to an area of a non-hollow structure of the first light-emitting sub-layer is (2:8)-(3:7).

10. An electronic device, comprising: the OLED according to claim 1.

11. The electronic device according to claim 10, wherein the electronic device is a display apparatus or a backlight for a liquid crystal display.

12. The OLED according to claim 3, wherein the first material is a red light-emitting material or an orange light-emitting material, and the second material is a blue light-emitting material.

13. The OLED according to claim 4, wherein the first material is a red light-emitting material or an orange light-emitting material, and the second material is a blue light-emitting material.

14. The OLED according to claim 12, wherein the first material is a red phosphorescent material or an orange phosphorescent material, and the second material is a blue phosphorescent material.

15. The OLED according to claim 13, wherein the first material is a red phosphorescent material or an orange phosphorescent material, and the second material is a blue phosphorescent material.

16. The electronic device according to claim 10, wherein an energy gap of a second material of the second light-emitting sub-layer is larger than an energy gap of a first material of the first light-emitting sub-layer.

17. The electronic device according to claim 16, wherein the OLED is a bottom-emission OLED, the first carrier transport layer is a hole transport layer, the second carrier transport layer is an electron transport layer, and the hole transport layer, the first light-emitting sub-layer, the second light-emitting sub-layer and the electron transport layer are arranged in sequence.

18. The electronic device according to claim 16, wherein the OLED is a top-emission OLED, the first carrier transport layer is a hole transport layer, the second carrier transport layer is an electron transport layer, and the electron transport layer, the first light-emitting sub-layer, the second light-emitting sub-layer and the hole transport layer are arranged in sequence.

19. The electronic device according to claim 16, wherein the first material is a red light-emitting material or an orange light-emitting material, and the second material is a blue light-emitting material.

20. The electronic device according to claim 19, wherein the first material is a red phosphorescent material or an orange phosphorescent material, and the second material is a blue phosphorescent material.

* * * * *